(12) United States Patent
Miller et al.

(10) Patent No.: US 7,230,836 B2
(45) Date of Patent: Jun. 12, 2007

(54) REMOTE ENCLOSURE SYSTEMS AND METHODS OF PRODUCTION THEREOF

(75) Inventors: William Miller, Liberty Lake, WA (US); Kelly Johnson, Spokane, WA (US)

(73) Assignee: Purcell Systems, Inc., Spokane Valley, WA (US)

( * ) Notice: Subject to any disclaimer, the term of this patent is extended or adjusted under 35 U.S.C. 154(b) by 0 days.

(21) Appl. No.: 10/793,619

(22) Filed: Mar. 4, 2004

(65) Prior Publication Data

US 2005/0128722 A1  Jun. 16, 2005

Related U.S. Application Data

(63) Continuation-in-part of application No. 10/481,306, filed as application No. PCT/US02/34800 on Oct. 30, 2002.

(60) Provisional application No. 60/379,480, filed on May 10, 2002.

(51) Int. Cl.
*H05K 7/14* (2006.01)
*H05K 7/18* (2006.01)

(52) U.S. Cl. .................. 361/797; 361/800; 361/796; 174/51

(58) Field of Classification Search ............... 361/752, 361/797, 800, 796, 825, 826, 816, 818; 174/51, 174/35 R
See application file for complete search history.

(56) References Cited

U.S. PATENT DOCUMENTS

| | | | | |
|---|---|---|---|---|
| 4,616,177 A | * | 10/1986 | McClain et al. | 324/156 |
| 5,001,602 A | | 3/1991 | Suffi et al. | 361/390 |
| 5,292,189 A | | 3/1994 | Lau et al. | 312/265 |
| 5,784,249 A | * | 7/1998 | Pouliot | 361/622 |
| 5,801,921 A | * | 9/1998 | Miller | 361/686 |
| 6,185,098 B1 | | 2/2001 | Benavides | 361/695 |

(Continued)

FOREIGN PATENT DOCUMENTS

GB    2217520    10/1989    ................ 5/4

OTHER PUBLICATIONS

Northern Technologies, Emerson Network Power; Advertisement: "Extreme Weather Will Happen!" (3 pages).

(Continued)

*Primary Examiner*—Tuan Dinh
*Assistant Examiner*—Hung S. Bui
(74) *Attorney, Agent, or Firm*—Sandra P. Thompson; Buchalter Nemer

(57) ABSTRACT

Remote enclosure systems have now been designed that meet the following goals: a) consolidate electrical terminations in one system; b) pre-terminate AC and DC equipment loads before site installation; c) provide multiple access points for facilitating equipment repair and installation; d) are easily configurable and expanded through the use of a modular frame design that accommodates a variety of customized side panels or the attachment of a variety of expansion cabinets; e) are aesthetically functional given the cable entry and routing structure; f) provide exceptional thermal management and g) reduce problems inherent in conventional electronic setups. Remote enclosure systems contemplated generally include: a) a frame system further comprising at least two side panels; b) at least one door coupled to the frame system; c) a cable management top assembly coupled to the frame system; d) at least one removable radio frequency (RF) management system.

22 Claims, 7 Drawing Sheets

U.S. PATENT DOCUMENTS

| | | | |
|---|---|---|---|
| 6,307,750 B1 | 10/2001 | Bendikas et al. | 361/725 |
| 6,330,152 B1* | 12/2001 | Vos et al. | 361/688 |
| 2002/0063498 A1 | 5/2002 | Blake et al. | 312/100 |

OTHER PUBLICATIONS

Northern Technologies, Emerson Network Power; Advertisement: "PowerBay Cabinet" (2 pages).

Marconi, Outside Plant, Power & Services; Advertisement: "Site Support Cabinet" (2 pages).

Argus Technologies; Advertisement: "Tempest TE10 Environmentally Controlled Power System" (2 pages).

Argus Technologies; Advertisement: "Tempest TE11 Environmentally Controlled Power System" (2 pages).

Argus; Advertisement: "Power Tempest Te15 Modular Cabinet" (2 pages).

International Preliminary Examination Report, Issued in International Application No. PCT/US02/34800, Filed Oct. 30, 2002.

International Search Report, Issued in International Application No. PCT/US02/34800, Filed Oct. 30, 2002 (US and GB references cited and listed above **).

Nokia Networks Oy; Installation instructions for SBS60V90 battery blocks, (2 pages); 1999.

Nokia Networks Oy; DSL Gateway High-Speed Internet Connection, Administrator Manual, (184 numbered pages); 2001.

* cited by examiner

REMOTE ENCLOSURE SYSTEMS AND METHODS OF PRODUCTION THEREOF

This application claims priority to U.S. Provisional Application No. 60/379,480 filed on May 10, 2002, PCT Application Ser. No.: PCT/US02/34800 filed on Oct. 30, 2002 and is a continuation in part of U.S. Utility application Ser. No. 10/481,306 filed on Jun. 8, 2004, which are commonly-owned and incorporated herein in their entireties by reference.

BACKGROUND

The telecommunications and data communications industries have grown exponentially in the last 5 to 8 years partly because both industries have been able to expand their customer base from customers that are close to the center of operations/transmissions to customers who are located a significant distance from the center of operations/transmissions. Expansion of data transmissions to customers located at significant distances from the center of operations is facilitated by remote sites that are portable and smaller than the center of operations site. Both industries include those utilities and industries that provide one-way and two-way data transmission and transportation. The telecommunications industry also includes wireless communications, wire-based communications and combinations thereof. Wireless communications includes infrared, satellite, antennae, etc. Wire-based communications includes fiber optic cable, conventional cable, coax cable, shielded and unshielded twisted pair cable, etc.

Remote sites usually contain electrical and telecommunications wiring and components, such as batteries, antennae, circuit boards, keypads and other related components that in many cases can be fragile, relatively inaccessible and certainly sensitive to the elements and other environmental conditions. Therefore, these remote sites should be enclosed or otherwise contained in a protective enclosure system.

The remote sites should be monitored to identify system failures, such as surge suppression modules, air conditioners and fans, power reciters, batteries and other alarmed user equipment. Additionally, the monitoring shall report site changes, such as cabinet intrusion, temperature and humidity changes. The remote sites should also be environmentally controlled, such as with air conditioning, heating, and humidity control, so that the electrical and telecommunications components do not break down, short out or otherwise degrade leading to poor performance of the components or products.

Also, the remote site should be easy to access. A remote enclosure system or protective enclosure system is the industry choice for protecting and accessing components and other instrumentation at a remote site. (see Prior Art FIG. 1) In Prior Art FIG. 1, the conventional remote enclosure system 10 comprises side panels 50, doors 70 with handles 78 and an additional component 76, such as an air conditioner unit or base power supply. Conventional enclosure systems are configured as a cabinet arrangement and are either built to standard specifications then modified on-site or are built to custom specifications—which presents manufacturing/assembly line issues and problems.

Often times, in conventional remote enclosure systems, some components will be easy to access, swap out and repair; but other components will be difficult, if not impossible, to access without moving other components around or removing them altogether. The process of repairing, replacing or accessing difficult to access components can be made more difficult depending on the site location of the remote enclosure system and the environmental conditions surrounding the remote enclosure system.

Remote enclosure systems also present other layers of complexity when reviewing the viability of a remote site. If the remote site is small or otherwise constrained, the remote enclosure must be sufficiently small and accessible. If the remote site is in an area where there are environmental challenges, such as severe heat, rain, snow or extreme cold—the remote enclosure system should be able to withstand the environmental challenges, while being easy to access and easy with which to work.

Based on the drawbacks, disadvantages and cost issues of conventional remote enclosure systems, it would be useful to develop and implement a remote enclosure system that a) consolidates electrical terminations in one system; b) pre-terminates AC and DC equipment loads before site installation; c) provides multiple access points for facilitating equipment repair and installation; d) is easily configurable and expanded through the use of a modular frame design that accommodates a variety of customized side panels or the attachment of a variety of expansion cabinets; e) is aesthetically functional given the cable entry and routing structure; f) provides exceptional thermal management and g) reduces problems inherent in conventional electronic setups.

SUMMARY OF THE INVENTION

Remote enclosure systems have now been designed and are described herein that meet the following goals: a) consolidate electrical terminations in one system; b) pre-terminate AC and DC equipment loads before site installation; c) provide multiple access points for facilitating equipment repair and installation; d) are easily configurable and expanded through the use of a modular frame design that accommodates a variety of customized side panels or the attachment of a variety of expansion cabinets; e) are aesthetically functional given the cable entry and routing structure; f) provide exceptional thermal management and g) reduce problems inherent in conventional electronic setups.

Remote enclosure systems contemplated generally comprise: a) a frame system further comprising at least two side panels; b) at least one door coupled to the frame system; c) a cable management assembly coupled to the frame system; d) at least one removable radio frequency (RF) management system or assembly, such as an RF port plate, at least one RF cable, an RF port or any other suitable system for managing RF signals, coupled to at least one of the side panels, the frame system, the cable management assembly or combinations thereof and e) a bottom panel coupled to the frame system. The remote enclosure system may also comprise any number of components suitable for electronics, wireless and cable-based data and telecommunications applications, including air conditioner exhaust member, an air conditioner unit, a battery pack, a meter base, a power receptacle box, an alarm system or alarm device, an expansion cabinet, a coupling device or system, a pre-wiring system and/or a demarcation component.

DETAILED DESCRIPTION

Remote enclosure systems have now been designed and are described herein that meet the following goals: a) consolidate electrical terminations in one system; b) pre-terminate AC and DC equipment loads before site installation; c) provide multiple access points for facilitating equipment repair and installation; d) are easily configurable and expanded through the use of a modular frame design that accommodates a variety of customized side panels or the attachment of a variety of expansion cabinets; e) are aesthetically functional given the cable entry and routing structure; f) provide exceptional thermal management and g) reduce problems inherent in conventional electronic setups.

Remote enclosure systems contemplated generally comprise: a) a frame system further comprising at least two side panels; b) at least one door coupled to the frame system; c) a cable management assembly coupled to the frame system; d) at least one removable radio frequency (RF) management system or assembly, such as an RF port plate, at least one RF cable, an RF port or any other suitable system for managing RF signals, coupled to at least one of the side panels, coupled to at least one of the side panels, the frame system, the cable management assembly or combinations thereof and e) a bottom panel coupled to the frame system. The remote enclosure system may also comprise any number of components suitable for electronics, wireless and cable-based data and telecommunications applications, including air conditioner exhaust member, an air conditioner unit, a battery pack, a meter base, a power receptacle box, an alarm system or alarm device, an expansion cabinet, a coupling device or system, a pre-wiring system and/or a demarcation component.

Figure 1:
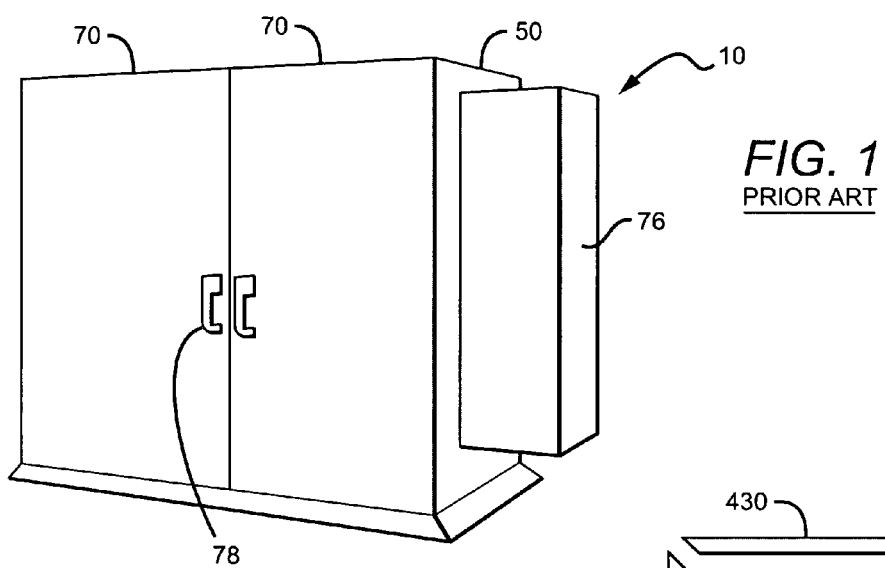
FIG. 1 shows a prior art conventional remote enclosure system.
Figure 2:
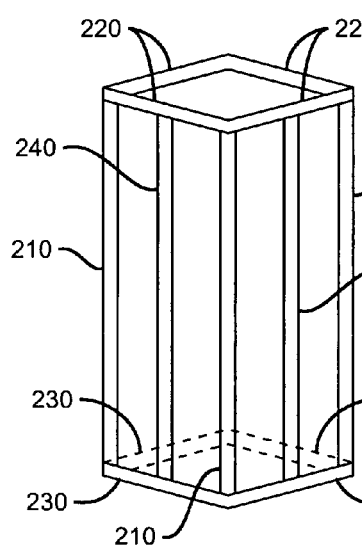
FIG. 2 shows a contemplated frame system.
Figures 3, 5:
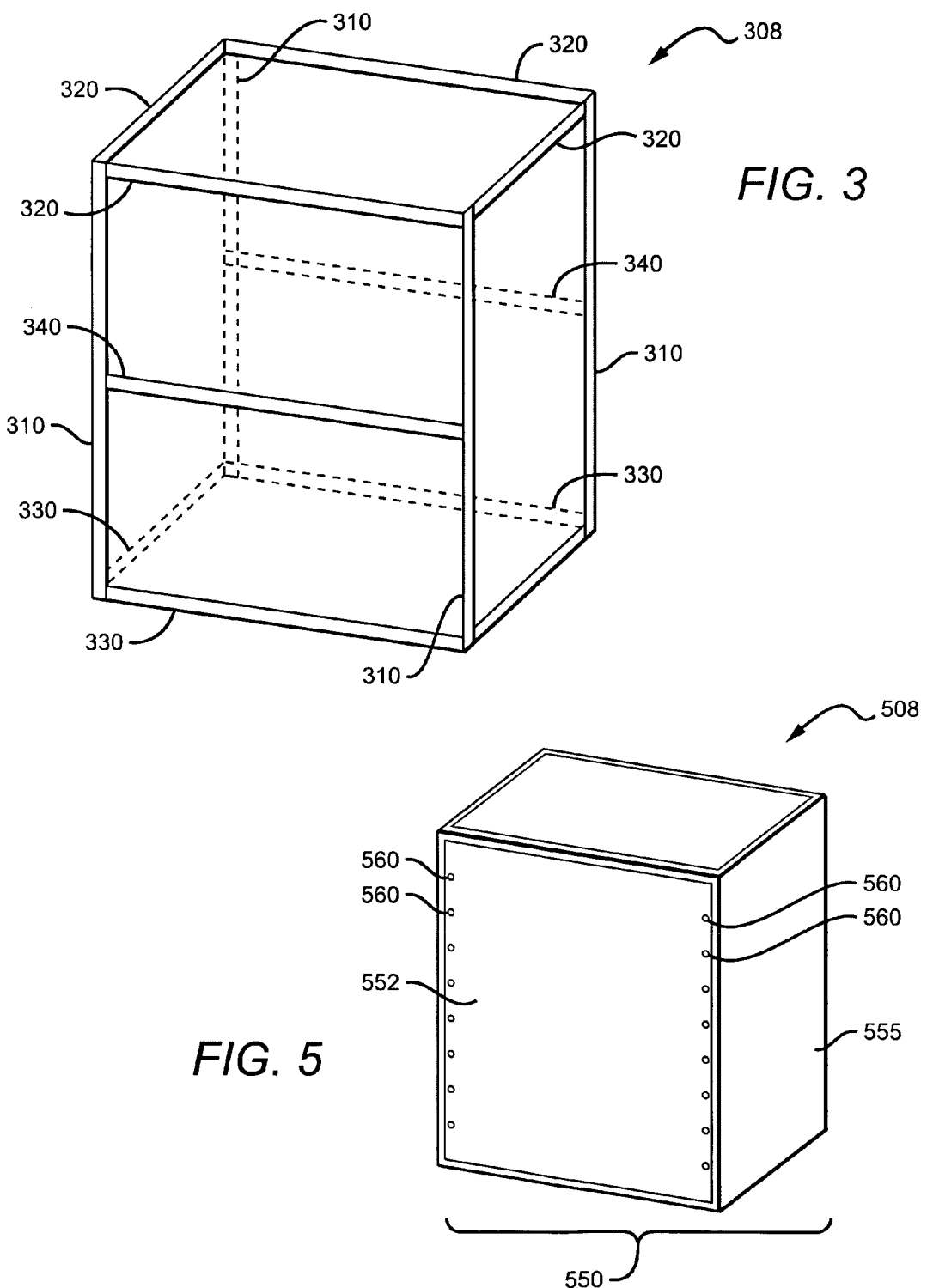
FIG. 3 shows another contemplated frame system.
FIG. 5 shows a contemplated frame system that comprises at least one removable side panel.

FIGS. 2 and 3 show examples of contemplated frame systems. In all contemplated embodiments, the frame system is designed to provide support for the side panels, the door(s), the expansion cabinet(s), the bottom panel, the top assembly and any other panels, systems, components, assemblies or plates that are coupled to the frame system, the side panels, the door(s), the expansion cabinet(s), the bottom panel and the cable management assembly. As long as the frame system provides support for all of the constituent components disclosed above, the frame system may be shaped or formed in any suitable shape and with any reasonable dimensions keeping in mind that this frame system is forming the foundation of the remote enclosure system that will be utilized at remote sites.

Figure 4:
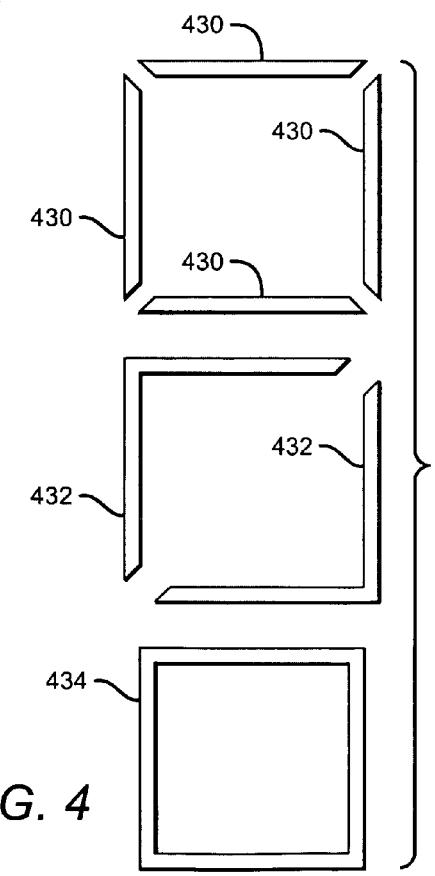
FIG. 4 shows contemplated components of a frame system.

FIG. 2 shows a contemplated frame system 208 having four (4) vertical corner beams 210 (one corner beam in back not shown), four (4) top horizontal cross beams 220, four (4) bottom horizontal cross beams 230 (two back bottom horizontal cross beams represented by dashed lines), and two (2) vertical side beams 240. FIG. 3 shows another contemplated frame system 308 comprising four (4) vertical corner beams 310 (one corner beam in back represented by dashed lines), four (4) top horizontal cross beams 320, four (4) bottom horizontal cross beams 330 (two bottom horizontal cross beams represented by dashed lines), and two horizontal side beams 340 (one horizontal side beam represented by dashed lines). It should be appreciated that all of the beams may be coupled to one another by any suitable manner, including soldering, bolts, adhesives, molding, grips or a combination thereof. It should be further appreciated that although the contemplated embodiments list, for example, four (4) bottom horizontal cross beams 230 and 330, that they may be coupled together before assembly of the frame system to form one (1) square or rectangular top frame. The same is true for the corner beams, the top horizontal cross beams, or any combination thereof. As used herein, the term "mold" or "molding" is used to describe the process whereby a material is either physically shaped or poured into a mold to form a particular and/or contemplated shape, structure or component. It should also be appreciated that what appears in the frame system as four (4) bottom horizontal cross beams 230 or 330 may be four (4) cross beams 430, two (2) sets of cross beams at 90° angles to one another coupled together 432 or one (1) square or rectangular beam assembly 434. (see FIG. 4)

FIGS. 8A-D show several contemplated embodiments of a coupling device or apparatus. Holes 809 can be punched, drilled or otherwise formed in the beams of the frame system 808 and corresponding holes 811 drilled, punched or otherwise formed in the side panels 850, expansion cabinet and/or other components, such as the cable management assembly 895. A screw 801 and nut 803 or bolt 801 and nut coupling device, along with a lock washer (not shown) can be used then to couple the frame system 808 with the side panels, the expansion cabinet and/or other components. The screw 801 or bolt 801 will be inserted through the hole 811 either on the frame system 808 or the other component 850 to the other component 850 or the frame system 808, respectively. The nut 803 is then attached and tightened on the bolt 801 or screw 801 in order to couple the frame system 808 with the side panels 850, the expansion cabinet(s) and/or the other components. In a more specific example, holes and corresponding match holes are punched, drilled or otherwise formed in the beams of the frame assembly, the side panels, the expansion cabinet, and/or another component, such as the cable management assembly. A ¼" sheer (shown in FIG. 8B as 802) with a bolt is placed in each hole. The bolt mates up with PEM® nut that is placed at the corresponding match hole. The ¼" sheer controls the compression of the gasket. As used herein, a PEM® nut or PEM® fastener are specific fasteners that can also be described as a self-clinching fastener, a captive fastener or a threaded insert. This method of mating and attaching components ensures that there will be little to no damage to the gasket in the field and also ensures that the compression can be controlled within a desired specification. Insulating tape or another method of insulation 877 can also be coupled to the frame system at the coupling interface 874 in order to further insulate the internal space of the remote enclosure system and is resistant to environmental conditions.

Contemplated frame systems further comprise at least two side panels. The side panels can perform several functions, including a) enclosing the internal space of the frame system; b) protecting the internal space of the frame system from the external environment; c) providing a point or area of attachment (also referred to herein as a "coupling interface") for other components, such as expansion cabinets, meter bases, air conditioners, RF management systems and combinations thereof, including the power assemblies disclosed in U.S. Provisional Application No.: 60/389,906 filed on Jun. 18, 2002 and PCT Application Ser. No.: PCT/US 03/19101, which are incorporated herein in their entirety; and d) providing a demarcation shield (also referred to herein as a "demarcation component") between electronic and/or power components and telecommunications components by shielding any electromagnetic waves produced by the electronic components from the telecommunications components. The side panels may be placed on or coupled with the frame system such that at least one is exposed to the outside environment and at least one is used as a point of connection, a coupling interface and/or demarcation with the at least one expansion cabinet. The side panels may be coupled to the frame system, such that they are all removable, they are all not removable or at least one is removable and the others are not. FIG. 5 shows a frame system 508 comprising two side panels 550, wherein one of the side panels is removable 552 and one side panel is not removable 555. For the side panel 552 that is removable, in this embodiment, the side panel is coupled to the frame system by a series of screw and nut pairs 560. The side panel 555 that is not removable may be coupled to the frame system by any suitable process, including soldering, welding, molding, pressure welding, adhesives and any combination thereof.

Figure 6:
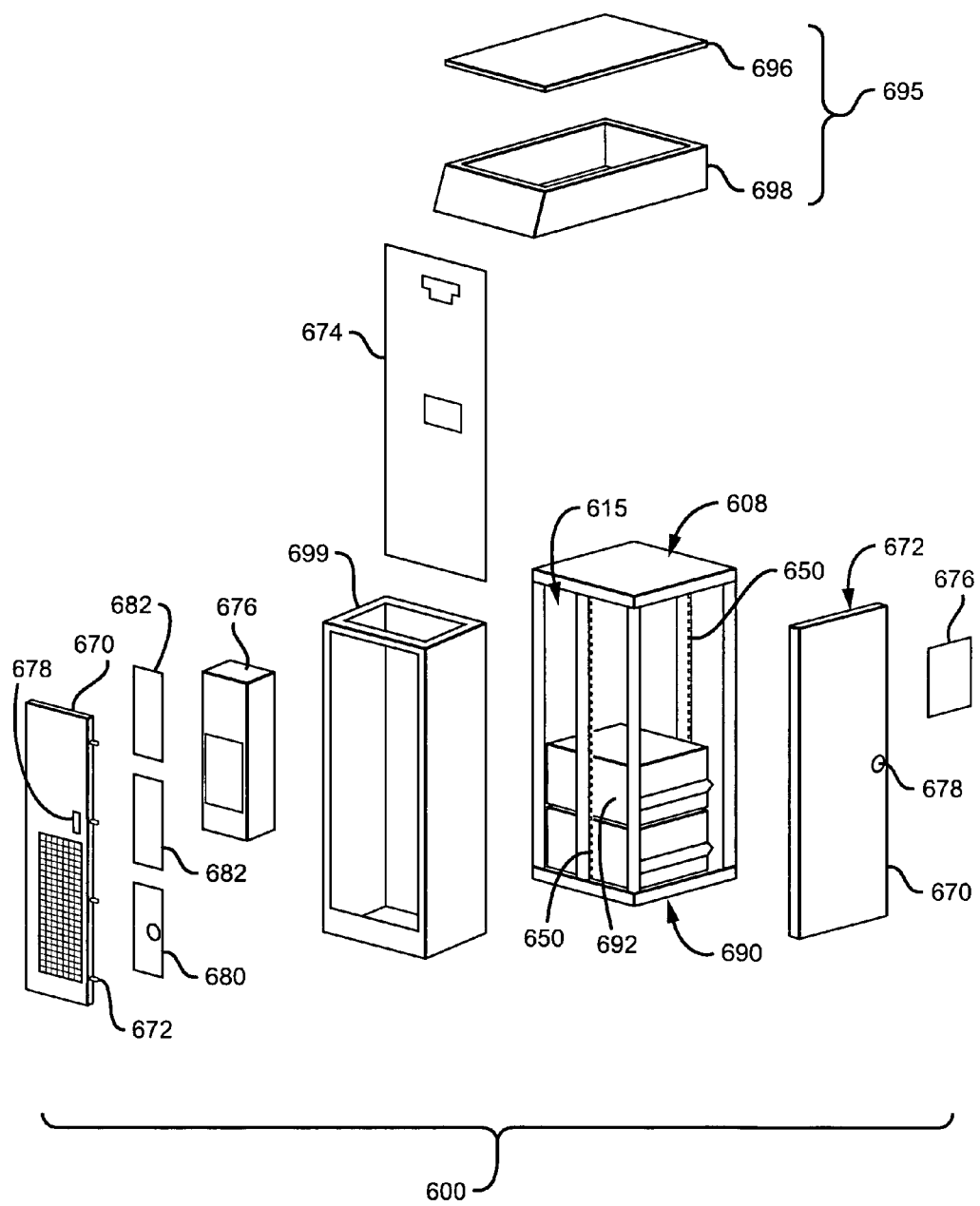
FIG. 6 shows components of a contemplated remote enclosure system.
Figure 7:
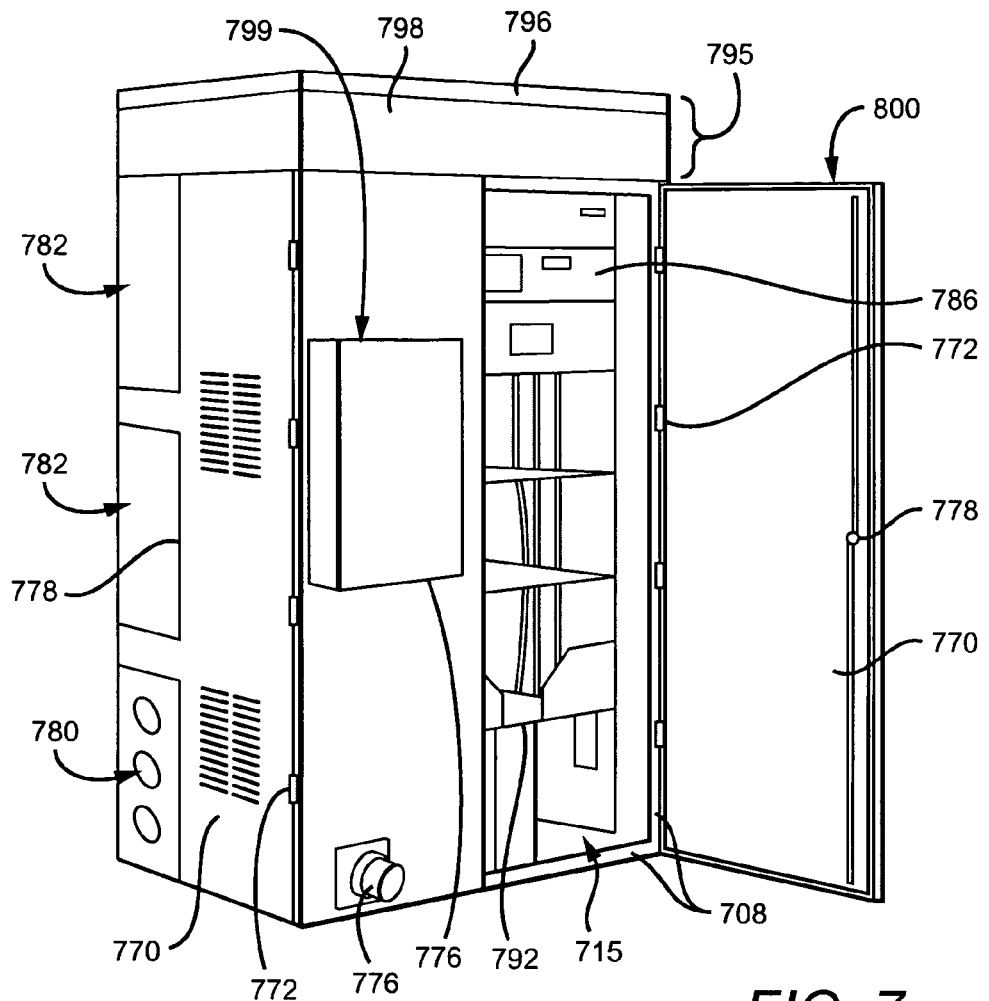
FIG. 7 shows components of another contemplated remote enclosure system.
Figure 8B:
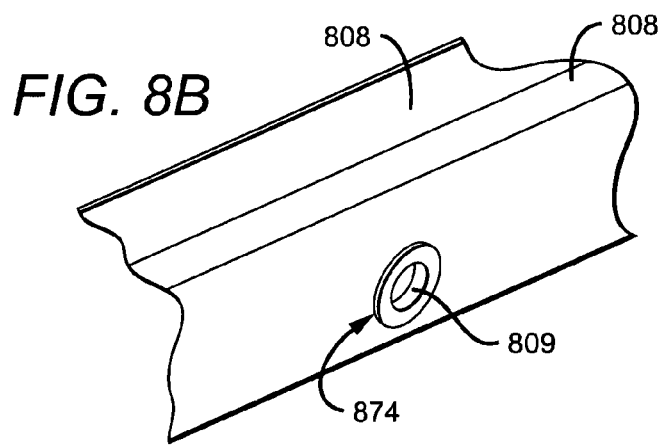
FIG. 8A-D shows the detail of contemplated coupling devices.
Figure 8A:
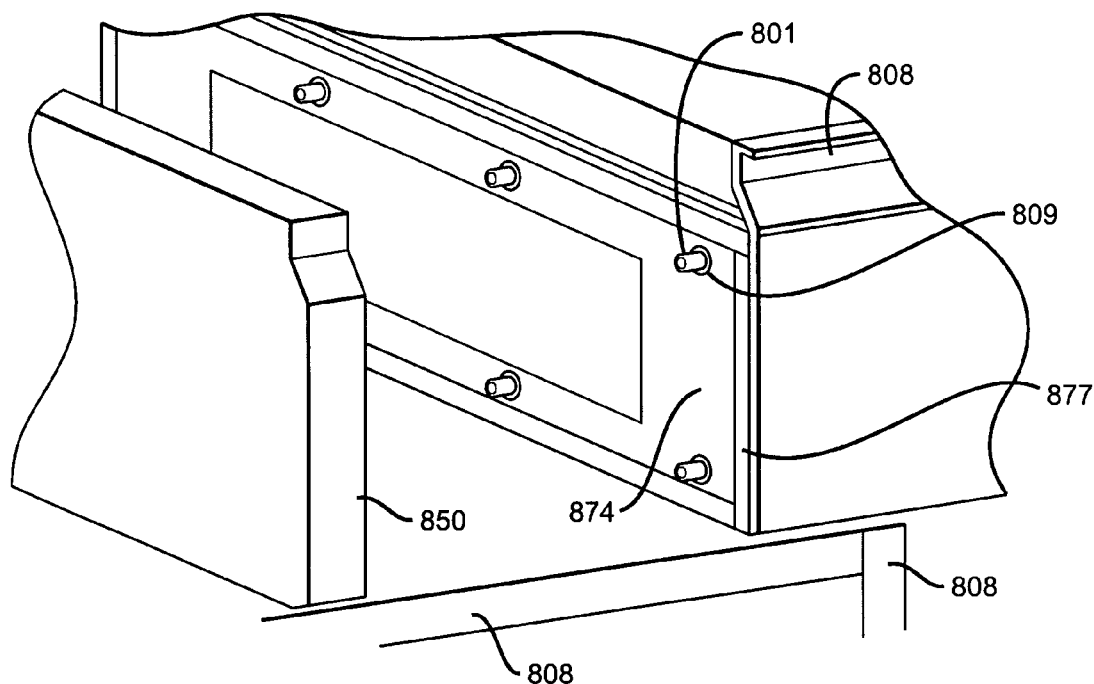
Figure 8C:
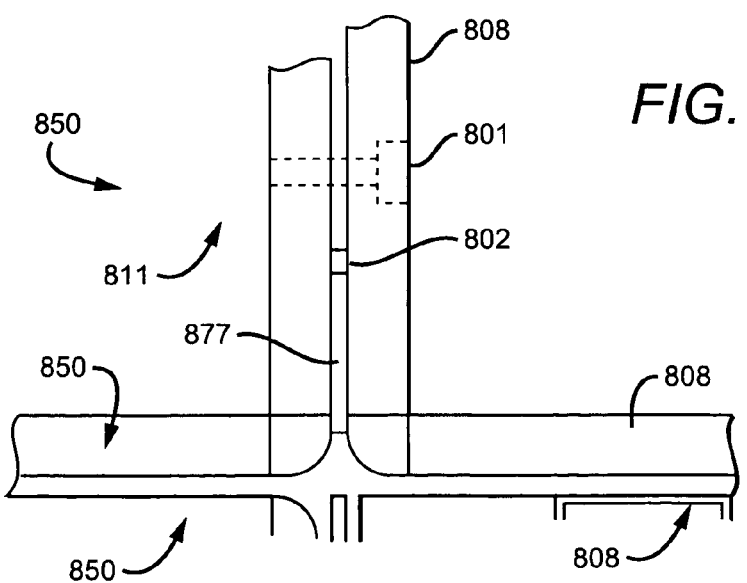
Figure 8D:
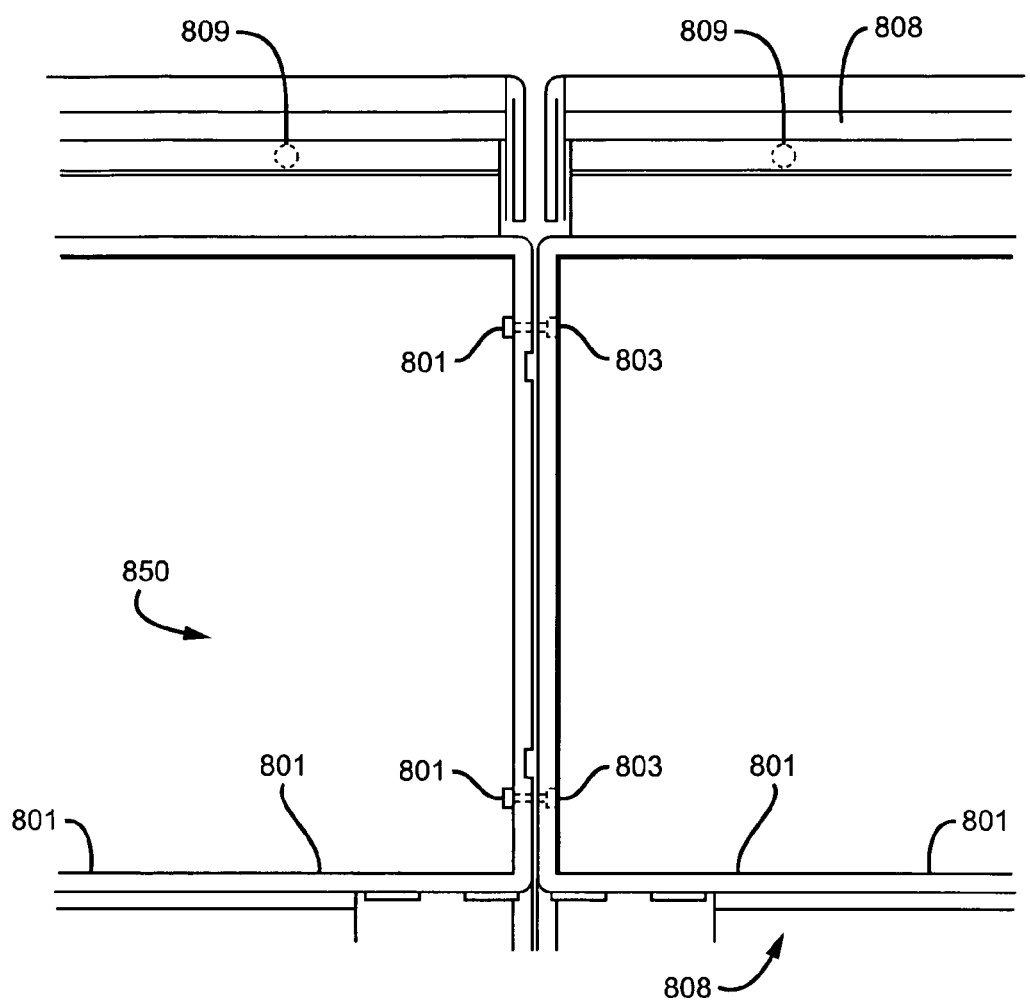

FIGS. 6 and 7 show components of a contemplated remote enclosure system 600, wherein the additional components, aside from those already disclosed, are shown and an assembled embodiment of a remote enclosure system 700, respectively. At least one door 670 and 770 is coupled to the frame system 608 and 708 by any suitable coupling apparatus 672 and 772 or process, including hinges, bolts, springs, tracks (for sliding doors) and combinations thereof. The at least one door 670 and 770 is designed to provide easy access to the internal space 615 and 715 of the remote enclosure system 600 and 700 and the components contained therein, while providing similar environmental protections as the at least two side panels 650 and 750. One or more of the at least one door 670 and 770 may also provide a point/area of attachment or coupling interface 674 and 774 (not shown) with another component 676 and 776, such as a meter base or temperature gauge. The at least one door 670 and 770 may also comprise a handle, knob, invention, protrusion or other apparatus 678 and 778 to move the door from the open to the closed position with respect to the internal space 615 and 715 of the remote enclosure system 600 and 700. The door 670 and 770 may also comprise a suitable lock, alarm system and/or alarm device (not shown in Figures). In some contemplated embodiments, at least one of the at least one door is removable. It should also be noted that, as used herein, the term "removable" means that the component can be or is capable of being physically and completely removed from the frame assembly, the cable management system, the RF management system or remote enclosure system. It should also be understood that the term "removable" may also mean that the component may be physically relocated from its original position, but not completely removed. An example of this second provision is when a door is opened by sliding it along a track to another part of the remote enclosure system, or when a removable RF management system, such as a port which will be discussed later, is slid on a track to another location on the frame system, side panel or other component of the remote enclosure system.

Remote enclosure systems contemplated herein comprise at least one removable RF management system 680 and 780 that is coupled to at least one of the side panels 650 and 750 (not shown) and/or to the frame system 608 and 708 and can be moved or configured to suit the installation requirements of the customer. In some embodiments, there will be additional plates 682 and 782 that are, in most cases, the same size/dimension as the RF management system 680 and 780, that are coupled to the side panels 650 and 750 and/or frame system 608 and 708 and that are designed to also be removed and replaced with at least one removable RF management system 680 and 780. The additional plate 682 and 782 will then be placed in the same space from where the at least one removable RF management system 680 and 780 was just removed, thus resulting in a closed internal space 615 and 715 inside the remote enclosure system 600 and 700. As shown in FIGS. 6 and 7, there are two removable and interchangeable plates 682 and 782 and at least one removable RF management system 680 and 780, so that the end user or customer can configure the enclosure system 600 and 700 to suit their particular installation needs by simply switching the at least one removable RF management system, such as an RF port 680 and 780 with another plate 682 and 782.

A bottom panel 690 and 790 is coupled to the bottom portion of the frame system 608 and 708, as shown in both FIGS. 6 and 7. The bottom panel 690 and 790 may be coupled to the frame system 608 and 708 by any suitable apparatus or process, including those previously described herein, and is designed to become at least a portion of the floor of the remote enclosure system 600 and 700. The bottom panel 690 and 790 may further be coupled to a support system or other type of system that facilitates movement of the remote enclosure system 600 and 700, such as that described in U.S. Provisional Application Ser. No.: 60/400,935 filed on Aug. 1, 2002 and PCT Application Ser. No.: PCT/US03/24046 filed on Jul. 31, 2003, which are incorporated herein in its entirety.

A cable management assembly 695 and 795 is coupled to the frame system 608 and 708. In FIGS. 6 and 7, the cable management system is shown coupled to the top of the frame system; however, it should be understood that the cable management system may be coupled to at least one of the side panels and/or the frame system or may be located at least partly inside the frame system. In this example, the cable management assembly 695 and 795 comprises a top panel 696 and 796 and an optional exhaust or vent member 698 and 798 between and coupled to both the frame system 608 and 708 and the top panel 696 and 796 is designed to vent air from the air conditioner, ozone formed from electronic components and any other fumes produced by the electronic or telecommunications components, such as smoke, burn-off fumes, volatile organic compounds, nitrogen-based compounds and combinations thereof.

Figure 9:
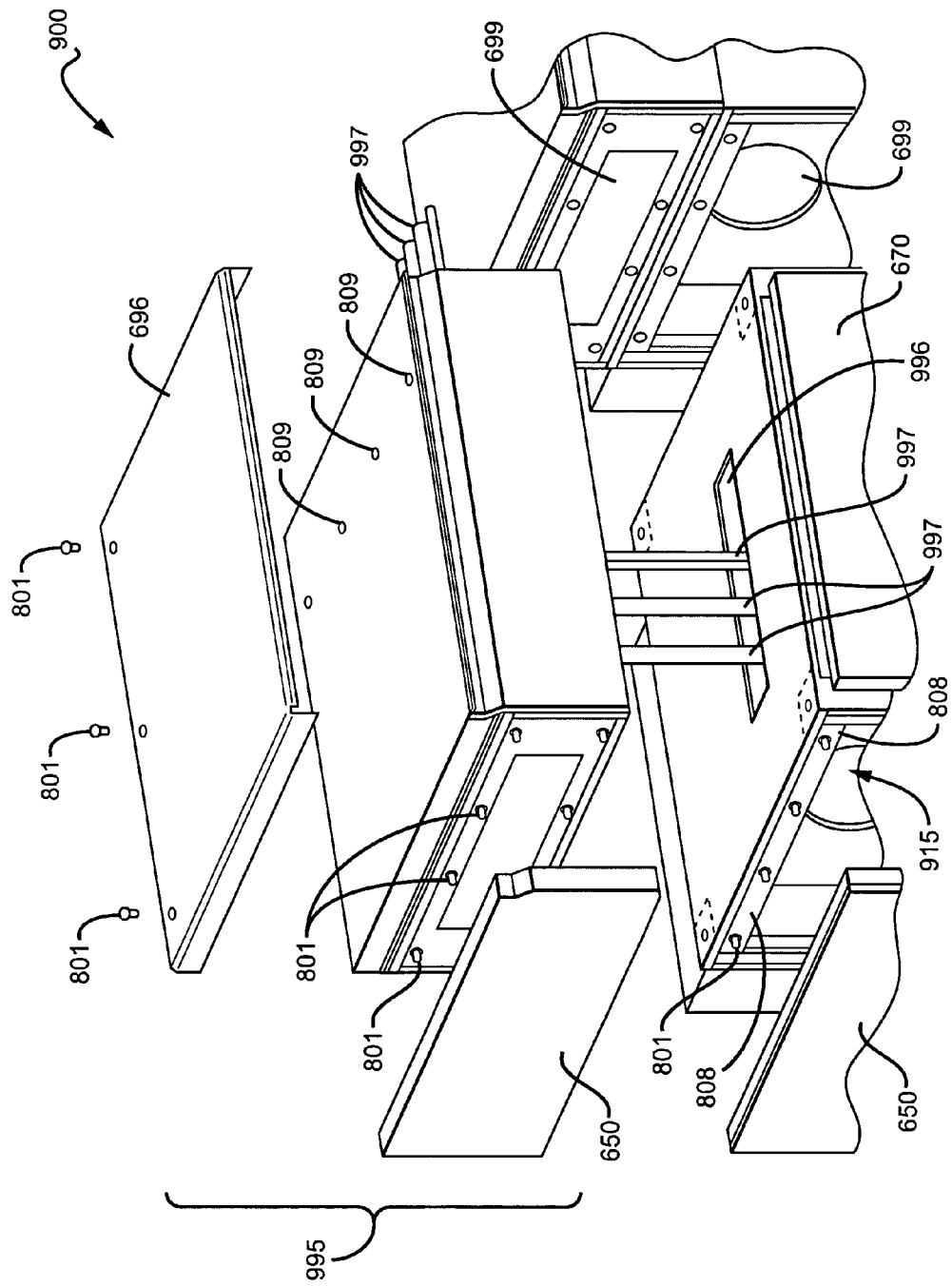
FIG. 9 shows a contemplated cable management assembly.

Another embodiment of the cable management assembly 995 is shown in FIG. 9. As shown, there is routing passageway 996 formed in the cable management assembly 995 that allows cables 997 and other electronic connections to be routed from the internal space 915 of the remote enclosure system 900 into the cable management assembly 995 and/or vice versa. Under normal conditions, the routing passageway 996 would violate the UL/NEMA rating, but because of the utilization of the coupling devices disclosed herein, the integrity of the remote access cabinet 900 is maintained and the UL/NEMA rating is not violated. The cable management assembly also provides a secure place for routing and storing the external wiring until installation can be completed. The NEMA rating relates to the environmental testing criteria that needs to be withstood in order to get a specific rating. For example, NEMA 3R would not allow falling rain striking the cabinet at trajectories greater than 60 degrees to enter the cabinet; however, under certain conditions, rain can enter the cabinet but there should be a means for the water to escape.

In the embodiments where the cable management system is located at least partly on one of the side panels, the cable management system is also designed to meet the UL/NEMA standards. In addition, like the cable management system located on top of the frame system, the cable management system located at least partly on one of the side panels can be utilized as a coupling system to couple more than one remote enclosure system depending on the needs of the customer or site. In yet other embodiments, the cable management system may be located at least partly inside the frame system.

The system also comprises a pre-wiring system, wiring and additional configuration in order to facilitate installation, access and or initial or intermediate set-up. One embodiment of the remote enclosure system contemplated herein comes completely pre-wired with a pre-wiring system and is pre-configured with electrical and telecommunications components so that installation time is greatly reduced and cost savings to the end user or customer is realized. Sample cost savings are shown in Table 1. As used herein, the phrase "pre-wiring system" means that most or all of the basic wiring is provided in the remote enclosure system with available connections and termination points before the remote enclosure system is placed at the remote site and subsequently activated. Pre-wiring systems contemplated herein may comprise fiber optic cable and wiring, conventional electrical wiring, and wireless transmissions wiring or wiring necessary to set up wireless communications.

Contemplated electronic components (shown in FIG. 7 as 786) comprise circuit boards, chip packaging, dielectric components of circuit boards, printed-wiring boards, and other components of circuit boards, such as capacitors, inductors, and resistors. As used herein, the phrase "remote site" is used herein to describe any site that is not the original assembly site for the remote enclosure system, and in many instances, refers to the site where the remote enclosure system is located before activation.

At least one expansion cabinet 699 or 799 can be coupled with the remote enclosure system 600 and 700 to expand the remote enclosure system 600 and 700. The at least one expansion cabinet 699 and 799 can contain telecommunications components or electronic components that are subject to a demarcation shield from the original remote enclosure system. The at least one expansion cabinet 699 and 799 is coupled to at least one of the frame system 608 and 708 and/or at least one of the side panels 650 and 750 at a coupling interface, which has been previously described. An insulating material 800 (not shown in FIG. 6) may also be located at the coupling interface to insulate the internal space 615 and 715 from the outside environment by closing any gaps between the at least one expansion cabinet 699 and 799 and the frame system 608 and 708 and/or the at least one side panel 650 and 750.

As used herein, the term "electronic component" also means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are static in operation, i.e., are ordinarily incapable of amplification or oscillation, and usually require no power for their characteristic operation. Examples are conventional resistors, capacitors, inductors, diodes, rectifiers and fuses.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators. Examples of semiconductor components are transistors, diodes, some lasers, rectifiers, thyristors and photosensors.

Electronic components contemplated herein may also be classified as power sources or power consumers. Power source components are typically used to power other components, and include batteries, capacitors, coils, and fuel cells. Power consuming components include resistors, transistors, integrated circuits (ICs), sensors, and the like.

Still further, electronic components contemplated herein may also be classified as discreet or integrated. Discreet components are devices that offer one particular electrical property concentrated at one place in a circuit. Examples are resistors, capacitors, diodes, and transistors. Integrated components are combinations of components that can provide multiple electrical properties at one place in a circuit. Examples are integrated circuits in which multiple components and connecting traces are combined to perform multiple or complex functions such as logic.

Telecommunications components include fiber optic cable and other optical materials, such as waveguides, data transmission wires and lines, copper wire, coax cable, keyboards and monitors and the like.

Electronic components 786, telecommunications components 786 and other suitable components 786 can be attached to or placed on a shelf or shelving system (shown in FIGS. 6 and 7 as 692 and 792, respectively) located in the internal space of the remote enclosure system, wherein the shelf or shelving system is coupled to at least one of the frame system, the side panels, the cable management top assembly and/or the bottom panel. As mentioned earlier, electronic components, telecommunications components and other suitable components may also be directly coupled to one or more of the frame system, side panels, cable management top assembly and bottom panel without the assistance of a shelf or shelving system. It is also contemplated that certain components, such as a meter base or air conditioning unit may be primarily located outside of the remote enclosure system.

Several embodiments of the remote enclosure system are formulated out of non-corrosive aluminum, however, any suitable metal, composite material, polymer or plastic material, fiberglass or appropriate or suitable material or combination of materials may be used, as long as the material or materials is/are capable of successfully and efficiently housing power and telecommunications components. The material(s) that is/(are) exposed to the outdoor environment must also be able to withstand environmental conditions, such as heat, rain, snow, hail, ice, cold weather, high wind, pressure changes and/or dust storms. As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include titanium, silicon, cobalt, copper, nickel, zinc, vanadium, aluminum, chromium, platinum, gold, silver, tungsten, molybdenum, cerium, promethium, and thorium. More preferred metals include titanium, silicon, copper, nickel, platinum, gold, silver and tungsten. Most preferred metals include titanium, silicon, copper and nickel. The term "metal" also includes alloys, metal/metal composites, metal ceramic composites, metal polymer composites, as well as other metal composites.

Table 2 lists a sample setup configuration of a contemplated remote enclosure system, but it should be appreciated that any appropriate set up may be accomplished inside this enclosure system. For example, a remote enclosure system can be pre-configured with a 300 A-48 VDC power distribution center and battery connection cables, however, a remote enclosure system of this type can be pre-configured with other types of power distribution centers and battery connection cables/wires.

Table 2 also shows specifications for one embodiment of the remote enclosure system; however, it should be appreciated that the remote enclosure system may be built or pre-configured to additional and/or different specifications. For example, under "Environmental" Table 2 shows that there is an air conditioner with a heater in the remote enclosure system. A humidifier or dehumidifier may also be added to the system, or an air conditioner without the heater and vice versa may be present or added in the system. Another example would be that the remote enclosure system can be designed to be smaller or larger depending on the needs of the remote site or remote lease site.

Keeping with this theme, a contemplated remote enclosure system can comprise a frame system where side, top and/or bottom panels and expansion cabinets are bolted in place to allow base modules that can be manufactured in high quantity optimized production runs. These contemplated remote enclosure systems can then provide rapid installation, set up, integration and utilization solutions for the customer, because instead of having to initially produce the entire cabinet, the enclosure system can be modified and plates produced that would bolt to the frame. Or two or more expansion cabinets can be bolted together and/or with the original frame system for greater space. Another advantage with this modular design is that assemblies can be outsourced to many fabricators depending on quantity and time requirements. Another benefit/advantage is, by virtue of the design, cabinetized solutions can be produced that are custom built, quickly and economically and provide an inherent growth platform for customers and end users.

Remote enclosure systems contemplated herein also offer at least one of the following benefits/advantages (which are not necessarily intended to be objects of the invention):

a. All site electrical terminations are accomplished in one system or unit without the need for additional systems or units, hence reducing the site electrical costs by approximately $6K-$10K per site.

b. Overall lease site dimensions are reduced significantly because all or most of the terminations are consolidated.

c. Pre-termination of AC and DC equipment loads reduces site installation time by 4-6 hours.

d. Network construction timelines are improved by facilitating site electrical/telecommunications inspections before and outside of the arrival of the radio base stations.

e. The remote enclosure system provides multiple equipment access points for facilitating equipment repair and installation.

f. The remote enclosure system modular cabinet design allows for site expansion through the attachment of additional systems or cabinets.

g. Cable entry/routing allows for improved site aesthetics, which helps the site approval process through the local government.

A remote enclosure system may be produced by: a) providing a frame system having at least two side panels, at least one door coupled to the frame system, at least one radio frequency (RF) management system or assembly, such as an RF port plate, at least one RF cable, an RF port or any other suitable system for managing RF signals coupled to at least one of the side panels, a bottom panel coupled to the frame system, or a top assembly coupled to the frame system; b) providing an expansion cabinet; and c) coupling the frame system to the expansion cabinet through a coupling interface. Providing the frame system or the expansion cabinet may comprise obtaining these components from an outsourced vendor or producing all or some of the components in house. In addition, coupling the frame system to the expansion cabinet through a coupling interface may comprise any suitable coupling apparatus or device, as mentioned previously. A cable management system may also be coupled to the remote enclosure system as described herein.

In some cases, the remote enclosure systems contemplated herein will comprise two or more of the benefits and advantages listed above, but it should be appreciated that remote enclosure systems contemplated herein may only comprise one of the benefits/advantages shown above, and that in no way limits the inherent usefulness of the remote enclosure system.

Thus, specific embodiments and applications of compositions and methods to construct and produce remote enclosure systems have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A remote enclosure system, comprising:

a frame system comprising at least two side panels and a top portion;

at least one door coupled to the frame system;

a cable management assembly separate from and coupled to the top portion of the frame system, wherein the cable management top assembly comprises an internal space such that cables and other electronic connections can be stored in the internal space of the cable management top assembly or can be routed into or out of the internal space of the frame system into the internal space of the cable management top assembly;

at least one radio frequency (RF) management system or assembly coupled to at least one of the side panels, the frame system, the cable management assembly or combinations thereof, wherein the at least one radio frequency (RF) management system manages RF signals; and a bottom panel coupled to the frame system.

2. The remote enclosure system of claim 1, further comprising at least one expansion cabinet coupled to one of the at least two side panels at a coupling interface.

3. The remote enclosure system of claim 2, wherein the at least one expansion cabinet is coupled to the frame system at the coupling interface.

4. The remote enclosure system of one of claims 1 or 2, wherein the at least one expansion cabinet is coupled with a plurality of screw and nut pairs at the coupling interface.

5. The remote enclosure system of claim 4, further comprising an insulating material between the at least one expansion cabinet and one of the frame system or the side panel at the coupling interface.

6. The remote enclosure system of claim 5, wherein the insulating material is insulating tape.

7. The remote enclosure system of claim 5, wherein the insulating material is resistant to environmental conditions.

8. The remote enclosure system of claim 1, wherein at least one of the at least two side panels is removable.

9. The remote enclosure system of claim 1, wherein the at least one door is removable.

10. The remote enclosure system of claim 1, wherein the bottom panel forms the floor section of the remote enclosure system.

11. The remote enclosure system of claim 1, wherein the cable management assembly comprises a top panel, a routing passageway and an air conditioner exhaust member.

12. The remote enclosure system of claim 1, further comprising at least one of an air conditioner unit, a battery pack, a meter base, a power receptacle box and a cable port.

13. The remote enclosure system of claim 1, further comprising at least one electronic component coupled to the frame system.

14. The remote enclosure system of claim 13, further comprising at least one telecommunications component coupled to at least one of the frame system or the at least one electronic component.

15. The remote enclosure system of claim 1, further comprising at least one telecommunications component coupled to the frame system.

16. The remote enclosure system of claim 1, further comprising an alarm system or an alarm device.

17. The remote enclosure system of claim 1, further comprising a pre-wiring system.

18. The remote enclosure system of claim 1, wherein the RF management system is removable.

19. The remote enclosure system of claim 1, wherein the RF management system comprises at least one RF port plate, at least one RF port, at least one RF cable and a combination thereof.

20. The remote enclosure system of claim 1, further comprising an electrical power component, at least one telecommunication component and a demarcation component that shields the electrical power component from the at least one telecommunication component.

21. The remote enclosure system of claim 20, further comprising an electrical power component, at least one telecommunication component and a demarcation component that shields the electrical power component from the at least one telecommunication component.

22. The remote enclosure system of claim 1, further comprising a shelving system coupled to at least one of the frame system, the bottom panel, the at least two side panels or the cable management top assembly.

* * * * *